(12) United States Patent　　(10) Patent No.:　US 7,045,823 B2
Suzuki　　(45) Date of Patent:　May 16, 2006

(54) OPTICAL SEMICONDUCTOR DEVICE HAVING SEMICONDUCTOR LASER AND ELECTROABSORPTIVE MODULATOR

(75) Inventor: Takahito Suzuki, Tokyo (JP)

(73) Assignee: Oki Electric Industry Co. Ltd., Tokyo (JP)

( * ) Notice: Subject to any disclaimer, the term of this patent is extended or adjusted under 35 U.S.C. 154(b) by 75 days.

(21) Appl. No.: 10/687,804

(22) Filed: Oct. 20, 2003

(65) Prior Publication Data

US 2004/0084683 A1　May 6, 2004

(30) Foreign Application Priority Data

Oct. 25, 2002　(JP)　............................. 2002-311590

(51) Int. Cl.
*H01L 27/15*　(2006.01)
*H01S 5/00*　(2006.01)
(52) U.S. Cl. .............................. 257/80; 257/84; 257/85; 372/26; 372/50; 372/703
(58) Field of Classification Search .................. 257/94, 257/96, 80, 84, 85, 103; 372/26, 50, 703
See application file for complete search history.

(56) References Cited

FOREIGN PATENT DOCUMENTS

| JP | 64-28984 | 1/1989 |
|---|---|---|
| JP | 07-94833 | 4/1995 |
| JP | 11-121787 | 4/1999 |
| JP | 2001-117058 | 4/2001 |
| JP | 2001-320124 | 11/2001 |

*Primary Examiner*—Minh-Loan Tran
(74) *Attorney, Agent, or Firm*—Takeuchi&Kubotera,LLP

(57) ABSTRACT

An optical semiconductor device comprises a semiconductor laser (11) including a lower clad layer, an active layer (4), and an upper layer formed in this order, an electroabsorptive modulator (12) including the lower clad, a light absorption layer (6), and the upper clad layer formed in this order, and a separation region (13) provided between the semiconductor laser and the electroabsorptive modulator. The upper clad layer extends from the semiconductor laser through the separation region to the electroabsorptive modulator and up to the side of the separation region.

11 Claims, 5 Drawing Sheets

OPTICAL SEMICONDUCTOR DEVICE HAVING SEMICONDUCTOR LASER AND ELECTROABSORPTIVE MODULATOR

BACKGROUND OF THE INVENTION

1. Field of the Invention

This invention relates to an integrated semiconductor device comprising a light modulator of an electro-absorption type semiconductor and an optical device, such as a semiconductor laser, useful for an optical communication and/or optical data processing.

2. Description of the Related Art

An integrated EA-DFB device comprising an electro-absorption type (hereinafter "EA") modulator and a distributed feed back type (hereinafter "DFB") laser converts high-speed electrical signals to optical signals.

Continuous wave (hereinafter "CW") light which is generated when electric current is applied to the DFB laser is input to the EA modulator through a butt joint section where the DFB laser and the EA modulator are joined. The butt joint section is an interface between an active layer of the DFB laser for oscillating a laser beam and a light absorption layer of the EA modulator. The EA modulator has an electro-absorption effect, wherein the amount of absorbed light is changed due to the change of the semiconductor band structure when a voltage is applied to the EA modulator. Accordingly, when a reverse bias voltage is applied to the EA modulator, the amount of absorbed light is increased so that light does not permeate through the light absorption layer of the EA modulator. When a voltage is not applied to the EA modulator, light permeates the EA modulator (ON condition) and, when a reverse voltage is applied, light is cut off (OFF condition), thereby to modulate light. The EA modulator converts electrical signals to optical signals by changing the light absorption rate by applying a voltage to the light absorption layer from outside.

FIGS. 4 and 5 show a conventional EA-DFB device. A DFB laser (hereinafter "LD") 41 and an EA modulator 42 are formed on a substrate. A separation region 43 is provided between an upper electrode 46 of the LD 41 and an upper electrode 48 of the EA modulator 42. In the LD 41, a lower clad layer 53, an active layer 54, an upper clad layer (not shown), and an ohmic contact layer (not shown) to be brought into contact with the electrode are formed in this order on a substrate 52. Tn the EA modulator 42, the lower clad layer 53, a light absorption layer 56, the upper clad layer, and the ohmic contact layer are formed in this order on the substrate 52. Tn the separation region 43, the lower clad layer 53, a wave guide layer 55, the upper clad layer, and the ohmic contact layer are formed in this order on the substrate 52. An etched channel 49 is provided on sides of the LD 41 and the EA modulator 42 so as to form a ridge structure.

A forward bias voltage is applied between the upper electrode 46 and a lower electrode 47 of the LD 41 so as to generate CW light from the active layer 54. A reverse bias voltage is applied between the upper electrode 48 and the lower electrode 47 of the EA modulator 42 so as to change the amount of light absorbed by the absorption layer 56 for performing modulation. The contact layer under a pad of the upper electrode 48 is etched so as to prevent deterioration of the frequency characteristics caused by the increased electric capacity of the pad electrode.

However, in this conventional EA-DFB device, when input light is intense, the vicinity of the incident area of the EA modulator 42, where the amount of absorbed light is the largest, is adversely affected by the heat generation by the absorption of light. Accordingly, there has been a problem that intense light cannot be input.

FIG. 6 shows an EA-DFB device proposed by Japanese Patent Application Kokai Number 2001-117058 to solve the above-mentioned problem. In the same manner as the conventional art shown in FIG. 5, an LD 61 and an EA modulator 62 are formed on a substrate, and a separation region 63 is provided between a upper electrode 66 of the LD 61 and an upper electrode 68 of the EA modulator 62. In the LD 61, a lower clad layer 73, an active layer 74, an upper clad layer (not shown), and an ohmic contact layer (not shown) to be brought into contact with the electrode are formed in this order on a substrate 72. In the EA modulator 62, the lower clad layer 73, a light absorption layer 76, the upper clad layer, and the ohmic contact layer are formed in this order on the substrate 52. In the separation region 63, the lower clad layer 73, a wave guide layer 75, the upper clad layer, and ohmic contact layer are formed in this order on the substrate 72. An etched channel 79 is provided on sides of the LD 61 and the EA modulator 62.

The EA-DFB device shown in FIG. 6, however, is provided with a region 64, where the upper clad layer is extended such that the channel 79 in the vicinity of the incident area of the EA modulator 62 is made narrower (the separation 63 region is made wider). This structure improves the heat-radiation property in the vicinity of the incident area where the rise of temperature is highest, thus enabling the input of more intense light.

However, the above EA-DFB device has a problem that the EA modulator and the LD are not completely separated electrically so that when a forward bias of +1.2 V is applied to the LD and a reverse bias of −3 V is applied to the EA modulator, the separation region between the EA modulator and the LD has a strong electric field. Consequently, the absorption of light is not performed in the EA modulator but in the separation region so that the heat generated in the separation region by photo-current is not radiated efficiently in the region 64 in the vicinity of incident area of the EA.

FIG. 7 shows the principle of heat generation in the above EA-DFB device. A forward bias of +1.2 V is applied between the upper and lower electrodes 66 and 67 of the LD 61 to emit CW light from the active layer 64 and a reverse bias of −3 V is applied between the upper and lower electrodes 68 and 67 of the EA modulator 62 to change the amount of light absorbed in the absorption layer 65. Under this condition, a high voltage is applied between the upper electrodes 66 and 68 so that a light absorption 69 is performed in the separation region 63 resulting in the increased heat generation in the separation region 63.

FIG. 8 shows the result of simulation for relationship between the positions of the LD, the separation region, and the EA modulator, and photo-current generated by the light absorption. The simulation shows that the photocurrent in the separation region is highest, which means that the heat-generation in the separation region is highest.

Also, a slab under the pad electrode of the EA modulator increases the electric capacity of the entire pad electrode, which adversely affects the frequency characteristics.

BRIEF SUMMARY OF THE INVENTION

Accordingly, it is an object of the present invention to provide a new or improved optical semiconductor device capable of efficiently radiating the heat generated by photo-current in the separation region so as to enable the input of intense light and controlling the electric capacity of the entire pad electrode so as to prevent deterioration of the frequency characteristics.

According to one aspect of the invention, an optical semiconductor device comprises a substrate, a semiconductor laser including a lower clad layer, an active layer, and an upper layer formed in this order on the substrate, an electroabsorptive modulator including the lower clad, a light absorption layer, and the upper clad layer formed in this order on the substrate, and a separation region provided between the semiconductor laser and the electroabsorptive modulator and including the lower clad layer, a wave guide layer, and the upper clad layer formed in this order on the substrate, wherein the upper clad layer extends from the semiconductor laser through the separation region to the electroabsorptive modulator, the semiconductor laser, separation region, and electroabsorptive modulator each have a side provided in parallel with each other, and the upper clad layer extends up to the side of the separation region. Also, a contact layer is provided on the upper clad layer, and a first and a second upper electrodes are provided on the contact layer in the semiconductor laser and the electroabsorptive modulator, respectively. A lower electrode is provided on an under-side of the substrate. In addition, a channel from which the upper clad layer is removed, is provided such that the channel surrounds the upper clad layer. The upper clad layer, which extends up to the side of the separation region, is called a slab and capable of efficiently radiating heat caused by the absorption of light.

Since the slab is not provided in the vicinity of the incident area of the EA modulator but in the separation region such that the slab extends up to the side of the separation region, the heat-radiation property of the EA-DFB device is improved, thus enabling the input of intense light. The channel extends up to the side of the separation region, the upper clad layer along the slab is removed, and no clad layer exists under the upper electrodes so that the increase of the electrical capacity of the pad electrodes is prevented, thus improving the frequency characteristics.

According to another aspect of the invention, the upper clad layer extends from the semiconductor laser through the separation region to the light modulator via each side thereof. That is, the slab joins with the upper clad layer outside the channel so that the heat-radiation property is further improved, enabling the input of more intensive light.

According to still another aspect of the invention, the contact layer in the separation region is removed and/or has a high resistance by ion-implantation so that the increase of the electrical capacity of the pad electrodes is prevented, improving the frequency characteristics and broadening the modulated band.

DESCRIPTION OF THE PREFERRED EMBODIMENT

Figure 1A:
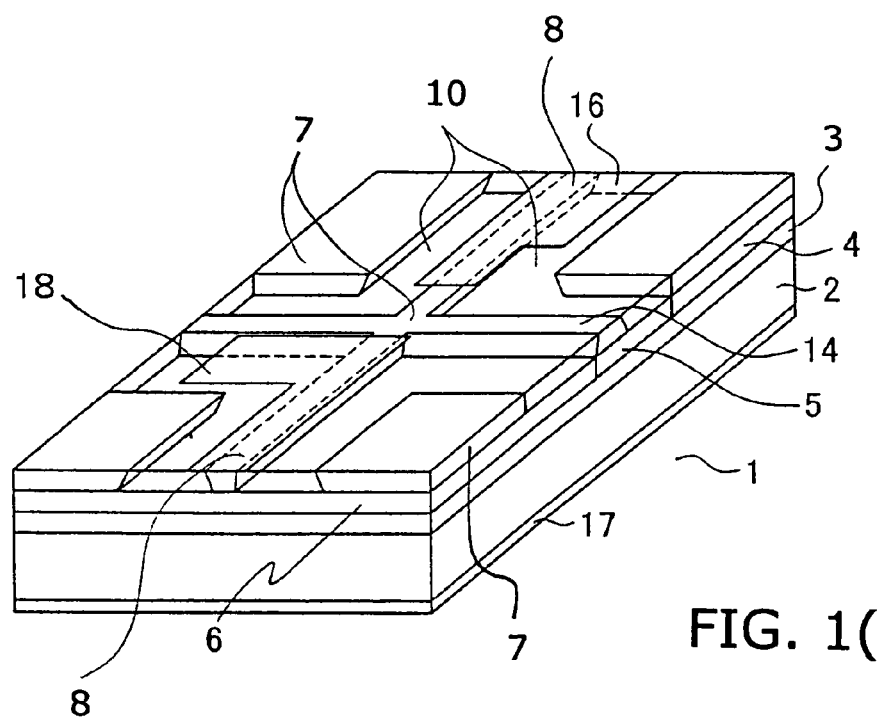
FIG. 1(a) is a perspective view of an EA-DFB device according to the first embodiment of the present invention.

The same reference numerals will be used for elements having a substantially identical function, and the description thereof will be omitted.

(First Embodiment)

Figure 1B:
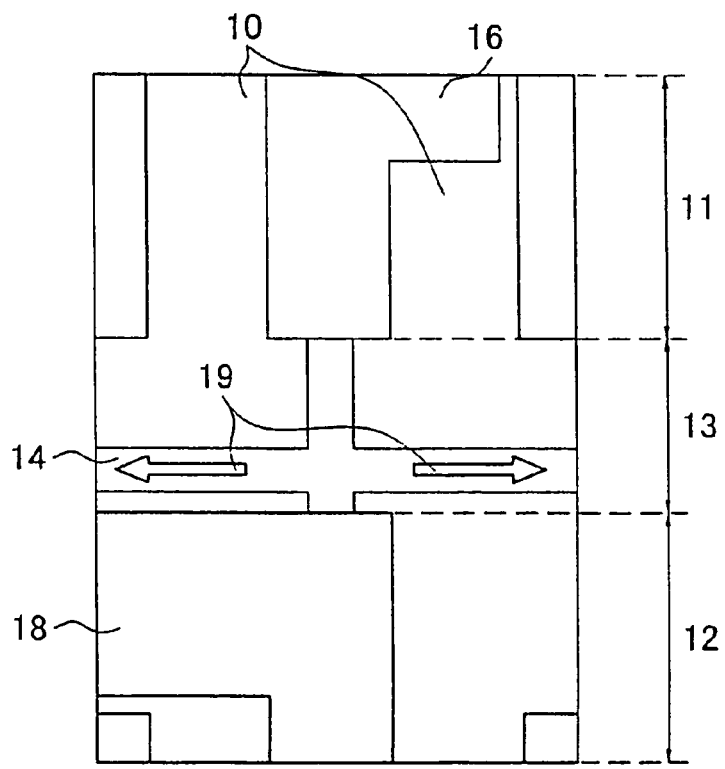
FIG. 1(b) is an enlarged top view of the RA-DFB device of FIG. 1(a).

In FIG. 1, a DFB laser (LD) 11 and an EA modulator 12 are formed on a substrate 2 and a separation region 13 is provided between an upper electrode 16 of the LD 11 and an upper electrode 18 of the EA modulator 12. In the LD 11, a lower clad layer 3, an active layer 4, an upper clad layer 7, and an ohmic contact layer 8 to be brought into contact with the electrode are formed in this order on a substrate 2. In the EA modulator 12, the lower clad layer 3, a light absorption layer 6, the upper clad layer 7, and the ohmic contact layer 8 are formed in this order on the substrate 2. In the separation region 13, the lower clad layer 3, a wave guide layer 5, the upper clad layer 7, and the ohmic contact layer 8 are formed in this order on the substrate 2.

N-type indium phosphorus (InP) is used for the lower clad layer 3, indium gallium arsenic phosphorus (InGaAsP) for the active layer 4 of the LD 11 and the light absorption layer 6 of the EA 12, and p-type indium phosphorus (InP) for the upper clad layer. A channel 10, which is not provided with the clad layer 7, is provided in the LD 11 and the EA modulator 12. A slab 14 includes the upper clad layer 7 which extends up to sides or edges of the EA DFB device in the separation region 13.

The slab 14 is not provided in the vicinity of the incident area in the EA modulator. It is provided in the separation region 13 where the heat generation is highest and extends up to the sides of the device so as to create a flow 19 of heat, thus increasing the heat-radiation property. The upper clad layer 7 is removed along the slab 14 to reduce the electrical capacity of the upper electrode 18, thus preventing the frequency characteristics from being deteriorated.

The operation principle is substantially same as that of the conventional art. That is, a forward bias is applied between the upper and lower electrodes 16 and 17 to generate electric current in the LD to emit CW light and a reverse bias is applied between the upper and lower electrodes 18 and 17 to change the amount of light absorbed to perform modulation.

As stated above, the slab 14 is provided in the separation region 13 to enable the input of intense light by improving the heat-radiation property. Also, since the slab is not provided under the pad electrode and the upper clad layer along the slab is removed up to the sides of the device, the electrical capacity of the pad electrode is reduced so that the frequency characteristics are not affected adversely.

(Second Embodiment)

Figure 2:
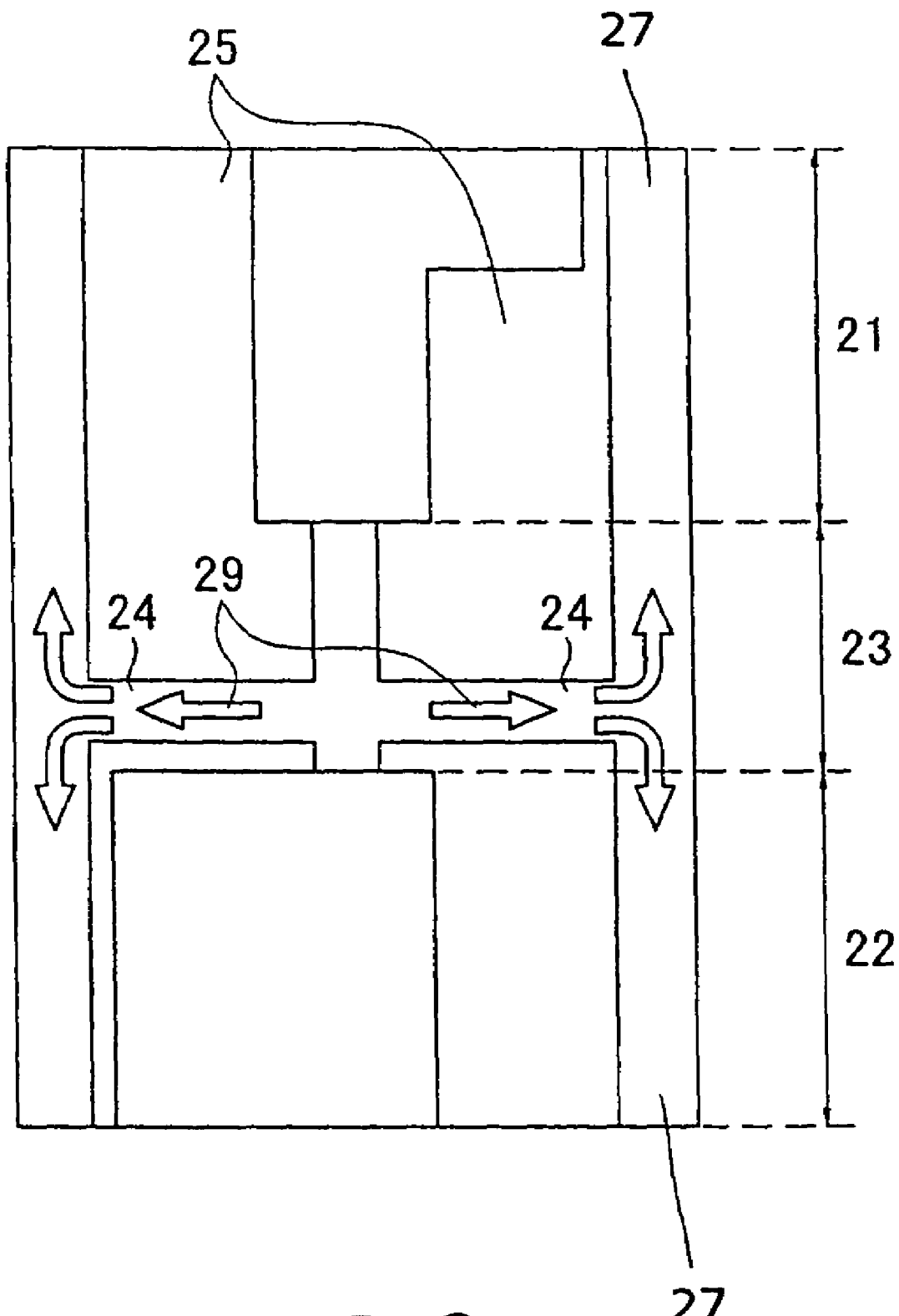
FIG. 2 is a top view of a separation region of an EA-DFB device according to the second embodiment of the present invention.

In FIG. 2, a separation region 23 is provided between an LD 21 and an EA modulator 22. In the same way as in the first embodiment, a slab 24 is provided in the separation region 23. The slab 24, however, joins with the upper clad layer 27 provided outside a channel 25 to further increase the heat radiation efficiency by improving a flow 29 of heat.

The operation principle is substantially same as that of the conventional art. That is, a forward bias is applied between the upper and lower electrodes to generate electric current in the LD to emit CW light and a reverse bias is applied between the upper and lower electrodes 18 and 17 to change the amount of light absorbed, making modulation.

According to the second embodiment, although the frequency characteristics are worse than those of the first embodiment because of the increase of the electrical capacity of the pad electrode, the heat radiation property is better than that of the first embodiment because the slab joins with the regions outside the channel, thereby to enable the input of intense light.

(Third Embodiment)

Figure 3:
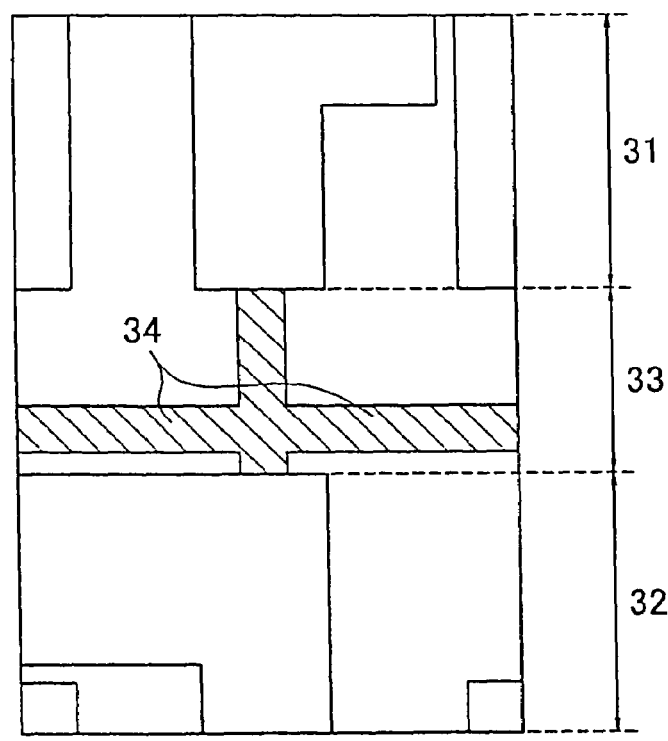
FIG. 3 is a top view of the vicinity of the separation region according to the third and fourth embodiments of the present invention.
Figure 4:
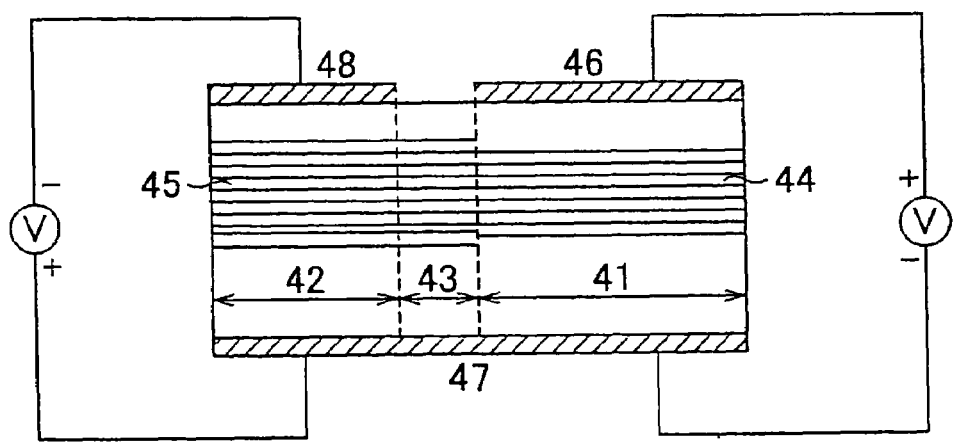
FIG. 4 is a schematic diagram of an electrical arrangement of an EA-DFB device according to the prior art.
Figure 5:
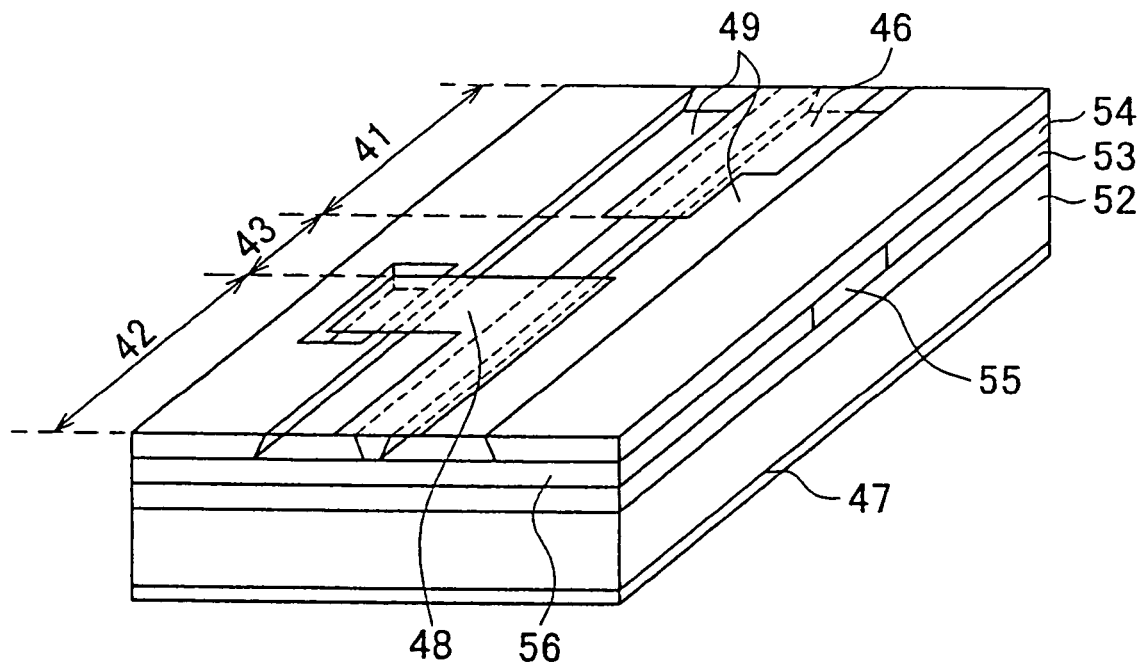
FIG. 5 is a perspective view of the EA-DFB device according to the prior art.
Figure 6:
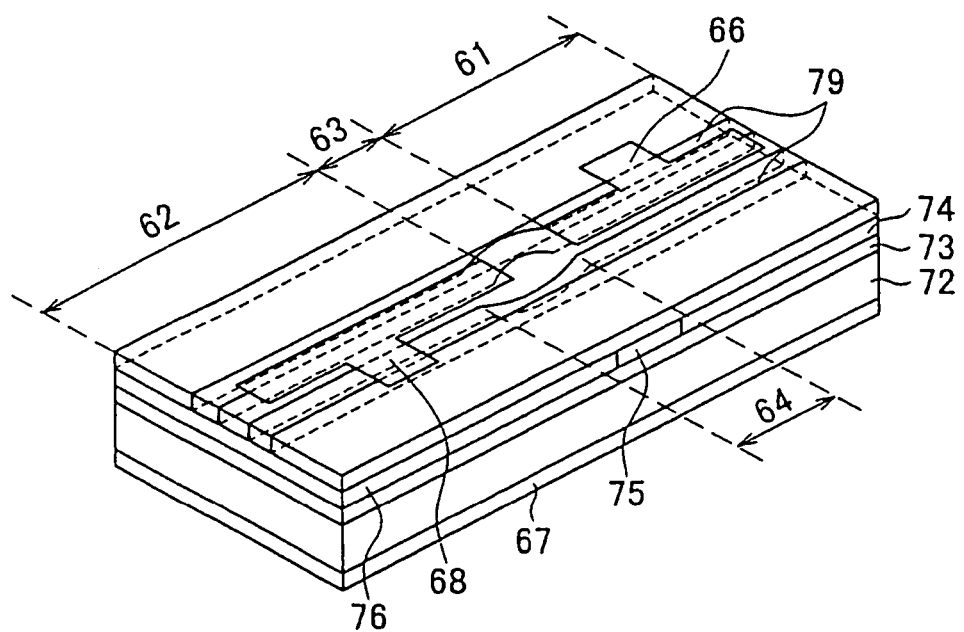
FIG. 6 is a perspective view of the EA-DFB device according to the Japanese Application Kokai Number 2001-117058.
Figure 7:
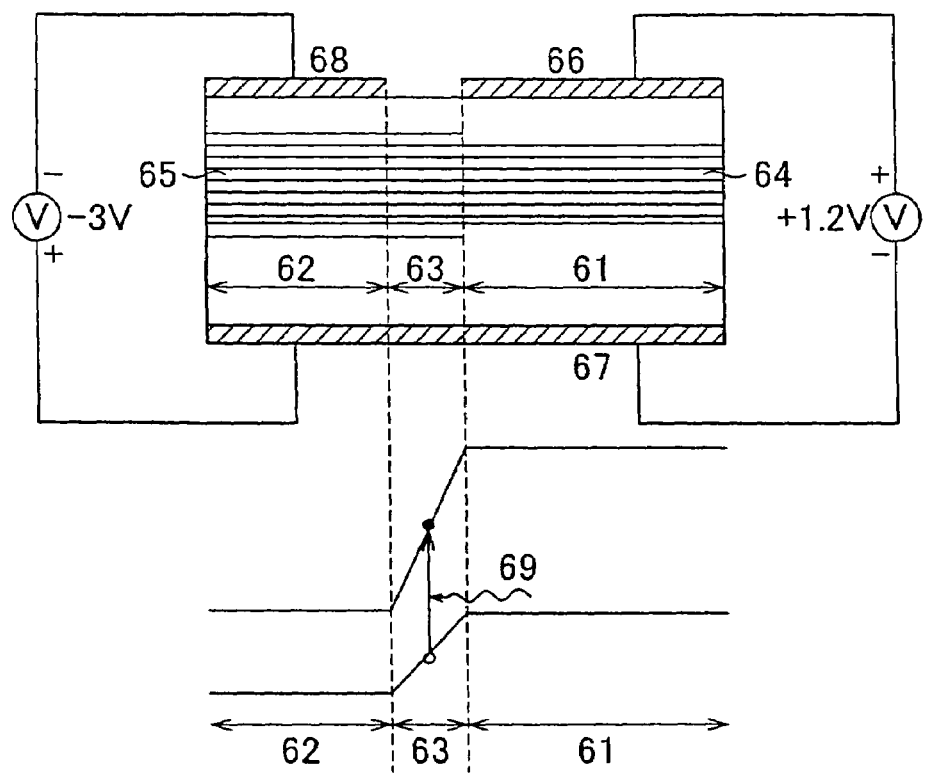
FIG. 7 is schematic diagram of the EA-DFB device of FIG. 6 showing the principle of heat generation.
Figure 8:
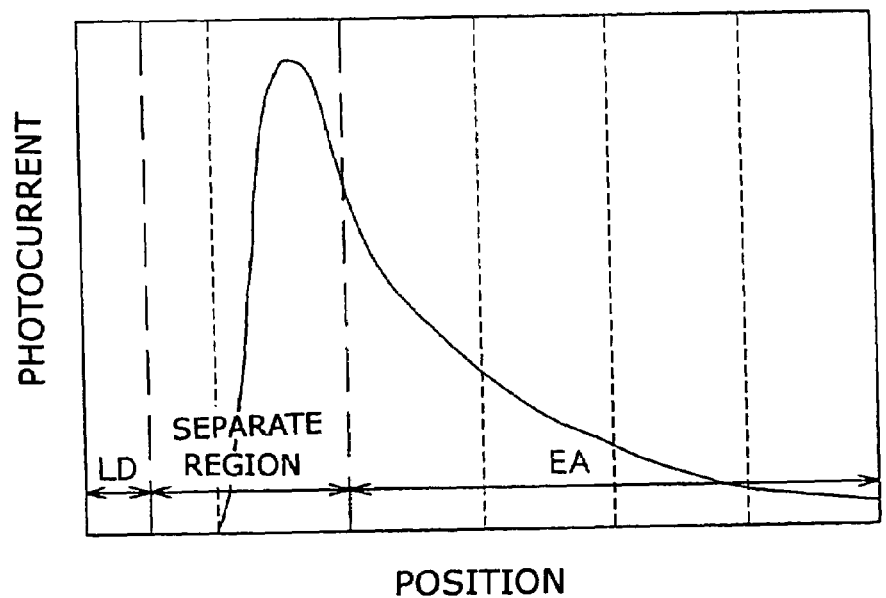
FIG. 8 is a graph showing a simulation result of photocurrent caused by light absorption of the EA-DFB device.

In FIG. 3, a separation region 33 is provided between an LD 31 and an EA modulator 32. In the same way as in the first embodiment, a slab 34 is provided in the separation region 33. However, according to the third embodiment, a contact layer provided on the upper clad layer on the separation region 33 and the slab 34, which is hatched with diagonal lines, is removed to reduce the electrical capacity of the pad electrode.

The operation principle is substantially same as that of the conventional art. That is, a forward bias is applied between the upper and lower electrodes to generate electric current in the LD to emit CW light and a reverse bias is applied between the upper and lower electrodes 18 and 17 to change the amount of light absorbed, thereby providing modulation.

According to the third embodiment, in addition to the effect in the first embodiment, the frequency characteristics are improved and the modulated band is broaden because of the reduced electrical capacity of the pad electrode.

(Fourth Embodiment)

In the third embodiment, the contact layer in the hatched area in FIG. 3 is removed. In the fourth embodiment, however, the hatched area is made such that it has large resistance to reduce the electrical capacity of the pad electrode. For example, proton ($H^+$) is ion-implanted to the contact layer made of zinc(Zn)-doped type indium phosphorus (InP).

The operation principle is same as that of the conventional art. That is, a forward bias is applied between the upper and lower electrodes to generate electric current in the LD to emit CW light and a reverse bias is applied between the upper and lower electrodes 18 and 17 to change the amount of light absorbed, providing optical modulation.

According to the fourth embodiment, in the same manner as the third embodiment, the frequency characteristics are improved and the modulated band is broaden because of the reduced electrical capacity of the pad electrode.

Although preferred embodiments have been described above with reference to the accompanying drawings, the present invention is not limited to those embodiments. A number of variations and modifications are possible within the technical concept of the claimed invention and, therefore, such variations and modifications should belong to the scope of the present invention.

As fully described above, according to the present invention, a slab is provided in a separation region instead of in the vicinity of the incident area of EA modulator to enable the input of light having a high power by increasing the heat radiation property of the EA-DFB device. In addition, the slab is provided outside the pad electrode to reduce the electrical capacity of the pad electrode, thus improving the frequency characteristics and broadening the modulated band.

The invention claimed is:

1. An optical semiconductor device comprising:
   a substrate;
   a semiconductor laser including a lower clad layer, an active layer, and an upper clad layer formed in this order on said substrate;
   an electroabsorptive modulator including said lower clad layer, a light absorption layer, and said upper clad layer formed in this order on said substrate;
   a separation region provided between said semiconductor laser and said electroabsorptive modulator and including said lower clad layer, a wave guide layer, and said upper clad layer formed in this order on said substrate; and
   a channel from which said upper clad layer is removed, said channel being provided such that said channel surrounds said upper clad layer, said channel extending up to said side of said separation region, wherein
   said upper clad layer extends from said semiconductor laser through said separation region to said electroabsorptive modulator,
   said electroabsorptive modulator receives light generated from said semiconductor laser in a wave guide direction through the wave guide layer,
   said semiconductor laser, separation region, and electroabsorptive modulator each has a side provided in parallel with the wave guide direction of the light, and
   said upper clad layer extends in a direction crossing the wave guide direction up to said side of said separation region.

2. The optical semiconductor device according to claim 1, which further comprises a lower electrode provided on an under-side of said substrate.

3. The optical semiconductor device according to claim 1, wherein said upper clad layer extends from said semiconductor laser through said separation region to said electroabsorptive modulator via said each side.

4. An optical semiconductor device, comprising:
   a substrate;
   a semiconductor laser including a lower clad layer, an active layer, and an upper clad layer formed in this order on said substrate;
   an electroabsorptive modulator including said lower clad layer, a light absorption layer, and said upper clad layer formed in this order on said substrate;
   a separation region provided between said semiconductor laser and said electroabsorptive modulator and including said lower clad layer, a wave guide layer, and said upper clad layer formed in this order on said substrate;
   a contact layer provided on said upper clad layer, said contact layer having a high resistance;
   a first upper electrode provided on said contact layer in said semiconductor laser; and
   a second upper electrode provided on said contact layer in said electroabsorptive modulator, wherein
   said upper clad layer extends from said semiconductor laser through said separation region to said electroabsorptive modulator,
   said electroabsorptive modulator receives light generated from said semiconductor laser in a wave guide direction through the wave guide layer,
   said semiconductor laser, separation region, and electroabsorptive modulator each has a side provided in parallel with the wave guide direction of the light, and said upper clad layer extends in a direction crossing the wave guide direction up to said side of said separation region.

5. The optical semiconductor device according to claim 4, wherein said contact layer is removed from said separation region.

6. The optical semiconductor device according to claim 4, wherein said high resistance of said contact layer is made by ion-implantation.

7. The optical semiconductor device according to claim 4, which further comprises a lower electrode provided on an under-side of said substrate.

8. The optical semiconductor device according to claim 4, wherein said upper clad layer extends from said semiconductor laser through said separation region to said electroabsorptive modulator via said each side.

9. An optical semiconductor device, comprising:
a substrate,
a semiconductor laser formed on the substrate and including an active layer for generating a laser beam in a beam direction,
an electroabsorptive modulator formed on the substrate and including a light absorption layer for receiving the laser beam from the semiconductor laser to generate an electrical signal,
a separation region formed on the substrate between the semiconductor laser and the electroabsorptive modulator, said separation region having side portions extending in parallel to the beam direction,
a slab disposed in the separation region for radiating heat, said slab extending continuously from one of the side portions to the other of the side portions in a direction crossing the beam direction, and
a channel disposed in the separation region around the slab and extending between the side portions of the separation region.

10. The optical semiconductor device according to claim 9, further comprising a side slab disposed outside at lease one of the side portions of the separation region and extending in the beam direction, said slab being connected to the side slab.

11. The optical semiconductor device according to claim 9, wherein said semiconductor laser and said electroabsorptive modulator include upper electrodes, respectively, said slab being connected to at least one of the upper electrodes.

* * * * *